United States Patent
Tanaka

(10) Patent No.: US 7,217,079 B2
(45) Date of Patent: May 15, 2007

(54) SLIDE FORK

(75) Inventor: Hiroshi Tanaka, Kani (JP)

(73) Assignee: Murata Kikai Kabushiki Kaisha, Kyoto (JP)

( * ) Notice: Subject to any disclaimer, the term of this patent is extended or adjusted under 35 U.S.C. 154(b) by 240 days.

(21) Appl. No.: 10/735,622

(22) Filed: Dec. 16, 2003

(65) Prior Publication Data

US 2004/0151570 A1     Aug. 5, 2004

(30) Foreign Application Priority Data

Feb. 3, 2003     (JP)     ............................. 2003-025768

(51) Int. Cl.
*B65G 1/06* (2006.01)
(52) U.S. Cl. .................................... 414/663
(58) Field of Classification Search ................ 414/785, 414/786, 280, 282, 663, 749
See application file for complete search history.

(56) References Cited

U.S. PATENT DOCUMENTS

| | | | |
|---|---|---|---|
| 940,878 A * | 11/1909 | Jones et al. ................. | 414/663 |
| 3,318,469 A * | 5/1967 | Bigler ......................... | 414/663 |
| 5,207,555 A * | 5/1993 | Shirai ......................... | 414/662 |
| 5,397,211 A * | 3/1995 | Lloyd et al. ................ | 414/663 |
| 5,839,873 A * | 11/1998 | Lloyd et al. ................ | 414/280 |
| 6,050,366 A * | 4/2000 | Lyons ........................ | 187/200 |
| 6,199,490 B1 * | 3/2001 | Langer ....................... | 108/143 |

FOREIGN PATENT DOCUMENTS

| | | |
|---|---|---|
| JP | S62-124906 U | 8/1987 |
| JP | H2-142724 U | 12/1990 |
| JP | 10-35819 | 2/1998 |
| JP | H10-035819 A | 2/1998 |
| JP | 2000-317875 | 11/2000 |
| JP | 2002-172569 A | 6/2002 |
| JP | 2002-337077 A | 11/2002 |

OTHER PUBLICATIONS

Japanese Notification of Reason(s) for Refusal dated Apr. 25, 2006. issued in corresponding Japanese patent application No. 2003-025768.

* cited by examiner

*Primary Examiner*—Charles A. Fox
(74) *Attorney, Agent, or Firm*—Westerman, Hattori, Daniels & Adrian, LLP.

(57) ABSTRACT

In a slid fork comprising a base portion 4, a middle portion 6, and a top portion 8, a driving motor 20 rotates sprockets 22, 24 to drive chains 26, 36, respectively, at different speeds. The middle portion 6 is fixed to the chain 26, while the top portion 8 is fixed to the chain 36. The chains 26, 36 are driven using a predetermined speed and stroke ratios. No sprockets are provided at a leading end of the middle portion. Therefore, no dust is raised from shelves.

2 Claims, 3 Drawing Sheets

SLIDE FORK

FIELD OF THE INVENTION

The present invention relates to a slide fork which is used in a clean room and which can reduce the amount of dust raised.

BACKGROUND OF THE INVENTION

To transfer articles in a clean room or the like, a scholar arm is used if it is critical to avoid raising dust. Otherwise a slide fork is used. The structure of the slide fork is described in, for example, the Unexamined Japanese Patent Application Publication (Tokkai-Hei) No. 10-35819. In this slide fork, one end of a driving member such as chains or belts is fixed to a top portion. The other end is fixed to a base portion. Guide wheels such as sprockets or pulleys are arranged between these ends. In this case, the guide wheels are required at a leading end of a middle portion, and the chains or belts extend up to a leading end of the top portion. Accordingly, when the slide fork is advanced, dust may be raised from shelves or articles by the guide wheel arranged at the leading end of the middle portion.

With the increased sizes of semiconductor and liquid crystal substrates, the scholar arm may fail to provide a sufficient capability of transferring these articles. However, if the slide fork is used to transfer the articles, dust is disadvantageously raised from the shelves or articles.

SUMMARY OF THE INVENTION

It is a basic object of the present invention to provide a slide fork which can reduce the amount of dust raised from shelves or articles and which is thus suitable for the use in a clean room (Claims 1 to 3). It is an additional object of the present invention set forth in Claim 2 to provide a specific arrangement for accomplishing the basic object. It is an additional object of the present invention set forth in Claim 3 to use a common motor for driving both a middle portion and a top portion.

The present invention provides a slide fork that advances and withdraws a middle portion and a top portion relative to a base portion to move the top portion forward and backward to an article placed position, the slide fork being characterized in that the middle portion is fixed to a driving member for driving the middle portion and the top portion is fixed to a driving member for driving the top portion, the driving members being driven by at least one motor, the driving members and the motor being arranged closer to the base portion than to the article placed position so that the driving members and the motor do not overlap the article placed position in a vertical direction (Claim 1). Preferably, the driving members and the motor are arranged along a direction in which the middle and top portions advance and withdraw so that they do not substantially protrude from the base portion toward the article placed position.

Preferably, each of the driving members comprises a chain or a belt and the base portion is provided with the motor and guide wheels comprising sprockets or pulleys disposed at opposite ends of the chain or belt (Claim 2).

Particularly preferably, one motor is provided to drive at least one pair of sprockets or pulleys having different peripheral speeds, to in turn drive the driving members (Claim 3).

According to the present invention, the driving members for the middle and top portions and the driving motor are arranged so as not to overlap the article placed position in the vertical direction. Consequently, dust caused by the driving members or the motor may be raised from a position away from articles or shelves on which the articles are stored. This reduces the possibility of contaminating the articles (Claim 1).

In the aspect of the invention set forth in Claim 2, the chains or belts are used to advance and withdraw the middle and top portions, and the guide wheels for the chains or belts are provided on the base section. This reduces the possibility that articles are contaminated with dust caused by the guide wheels.

In the aspect of the invention set forth in Claim 3, the single motor drives the two sprockets or pulleys having the different peripheral speeds, to in turn drive the chains or belts, constituting each of the driving members. Thus, the common motor can be used for the two driving members. Furthermore, the driving members can be easily synchronized with each other.

DETAILED DESCRIPTION OF THE PREFERRED EMBODIMENTS

Figure 1:
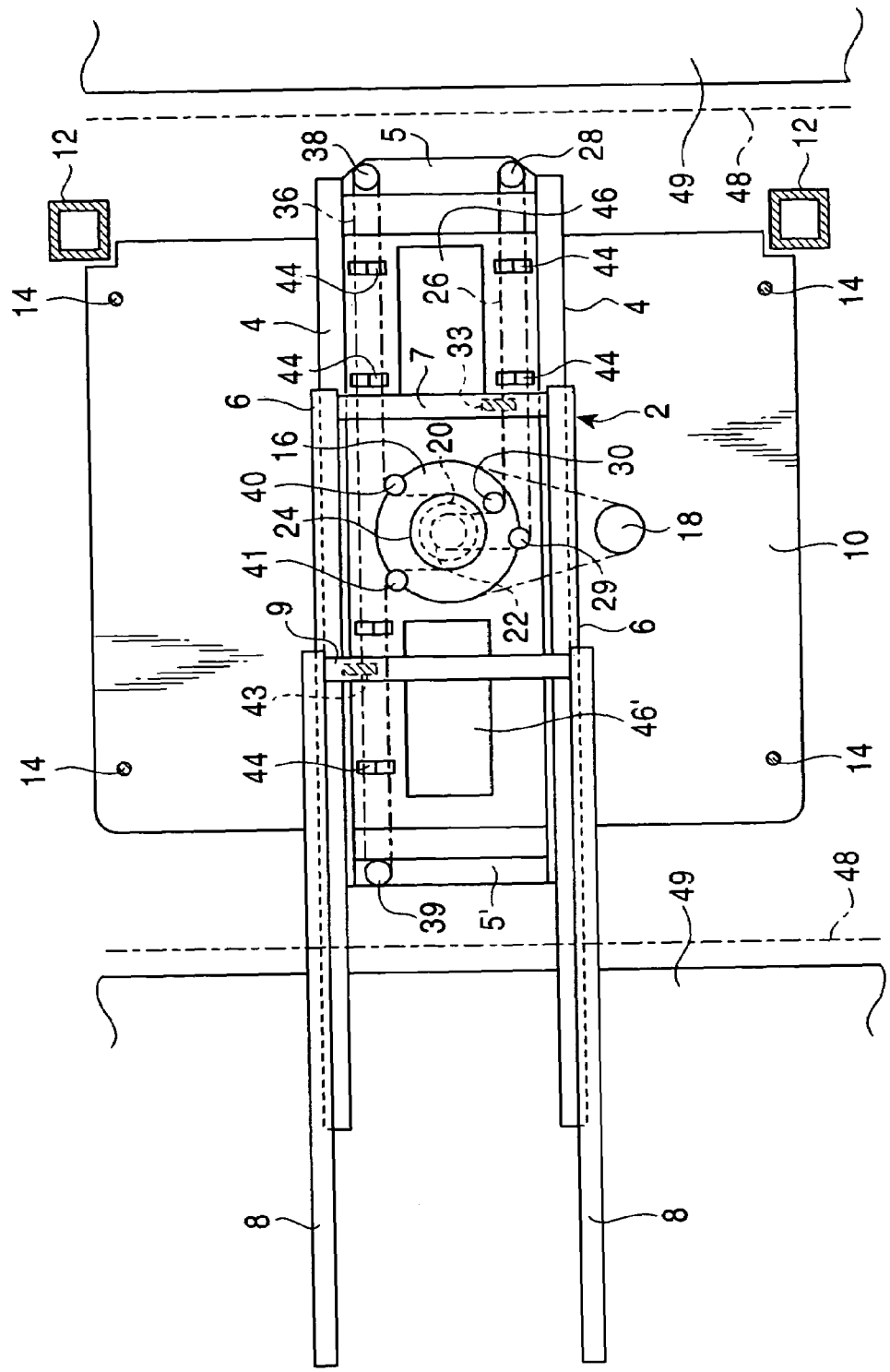
FIG. 1 is a plan view of a slide fork according to an embodiment.
Figure 2:
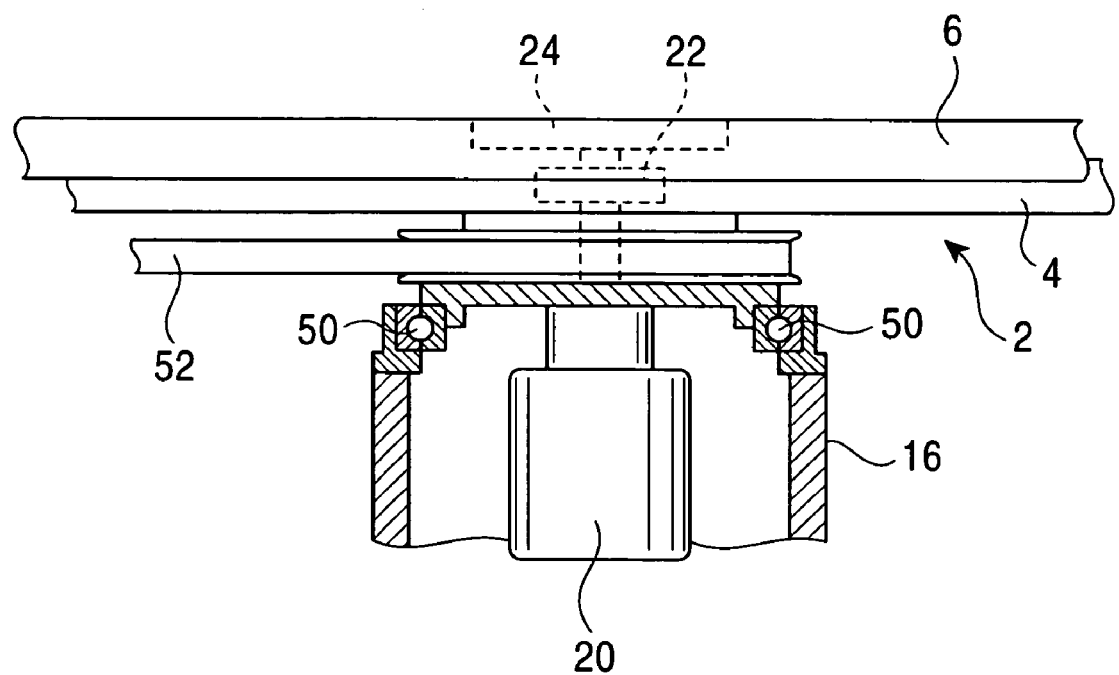
FIG. 2 is a sectional view of a turn table in the slide fork according to the embodiment.
Figure 3:
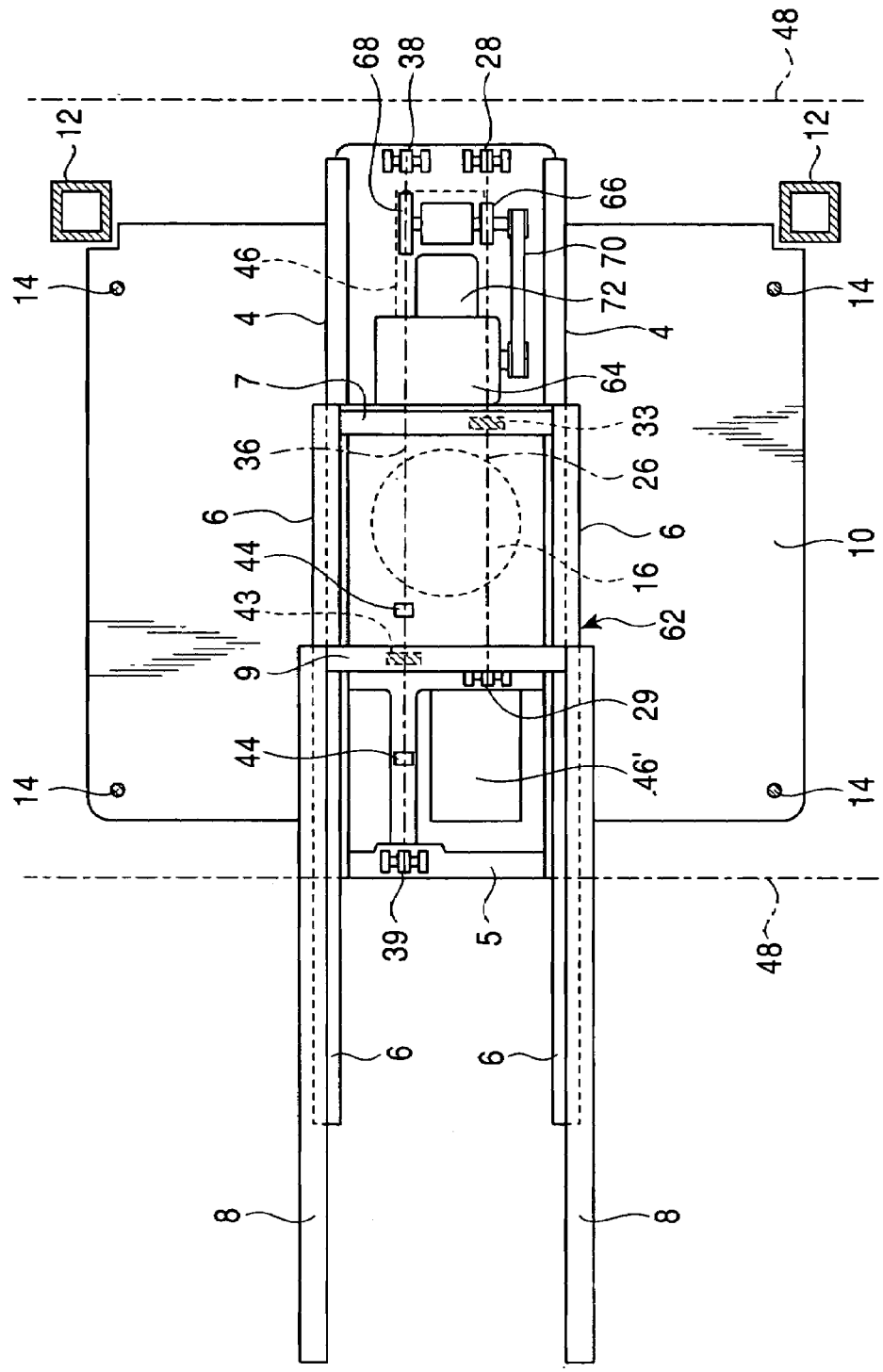
FIG. 3 is a plan view of a slide fork according to a second embodiment.

FIGS. 1 to 3 show an embodiment and its variation. In FIG. 1, 2 is a slide fork, and 4 is its base portion. The base portion 4 comprises frames constituting a lateral pair and connected together by arms 5, 5' arranged at the opposite ends of the base portion 4. 6 is a middle portion which slides on the base portion 4 and which comprises a lateral pair of frames connected together by an arm 7 provided at a proximal end of the middle portion 6. 8 is a top portion which slides on the middle portion 6 and which comprises a lateral pair of frames connected together by an arm 9 provided at a proximal end of the top portion 8. In the embodiment, the direction in which the middle portion 6 or the top portion 8 advances and withdraws is called an "advancing and withdrawing direction". The term "advancing" as used herein means that the middle portion 6 or the top portion 8 moves forward and away from the base portion 4. The term "withdrawing" as used herein means that the middle portion 6 or the top portion 8 returns to the base portion 4. Furthermore, the direction normal to the advancing and withdrawing direction is called a "lateral direction" or "width direction".

A slide fork 2 is mounted on a platform 10 of a stacker crane or the like. 12 is struts of the stacker crane. The platform 10 is elevated and lowered along the struts 12 using ropes 14 or the like. The slide fork 2 is placed on a turn table 16 and can be rotatively moved through, for example, 180 degrees. The slide fork 2 can thus transfer articles to both right and left sides of the platform 10. 18 is a rotative moving motor used to rotatively move the turn table 16. If the slide fork 2 has only to transfer articles to one side of the platform 10, the turn table 16 is unnecessary. In this case, the slide fork 2 is mounted on the stacker crane. However, the slide fork 2 may be mounted on an automated guided vehicle or a rail guided vehicle, or may independently constitute a transfer device.

In the embodiment shown in FIGS. 1 and 2, the bulk height of the slide fork 2 is reduced to enable a shelf 49 on which articles are stored to be effectively utilized at a lower position. Thus, a driving motor 20 is housed inside the turn table 16. A pair of sprockets 22, 24 having different diameters is provided coaxially with the driving motor 20. Thus, the sprocket 22 having a smaller diameter drives a chain 26 to advance or withdraw the middle portion 6. The sprocket 24 having a larger diameter drives a chain 36 to advance or withdraw the top portion 8.

The chain 26 is driven via sprockets 28, 29 arranged on the arm 5, provided at the proximal end of the base portion 4, a sprocket 30 operating as an idler, and the like. The arm 7 of the middle portion 6 is fixed to the chain 26 using a fixing portion 33 so as to advance and withdraw together with the chain 26.

The chain 36 for the top portion 8 is guided by sprockets 38, 39 arranged on the arms 5, 5', respectively, provided at the respective ends of the base portion 4. The chain 36 is fixed to a fixing portion 43 provided on the arm 9 of the top portion 8. Thus, the top portion 8 advances and withdraws in unison with motion of the chain 36. 40, 41 are sprockets operating as idlers. In this regard, if the chains 26, 36 are arranged over a long distance, they may hang down. Accordingly, a roller 44 or a bearing ball is preferably arranged in an appropriate area to prevent the chains 26, 36 from hanging down. The roller 44 is composed of a lateral pair of free rollers.

Since the sprockets 22, 24 have the different diameters, they have different peripheral speeds. Consequently, the chains 26, 36 operate at different speeds. It is thus possible to properly set the stroke ratio of the middle portion 6 to the top portion 8, thus synchronizing the advancement and withdrawal of these portions. The speed ratio of the middle portion 6 to the top portion 8 depends on their stroke ratio. The middle portion 6 has a stroke that is about half that of the top portion 8. Accordingly, the length of the chain 26 is set to be, for example, about half that of the chain 36. Instead of coaxially arranging the sprockets 22, 24 having the different diameters, it is possible to attach these sprockets 22, 24 to different shafts and operate them at different peripheral speeds using speed change gears or belts.

In the slide fork 2, dust is expected to rise from the vicinity of the turn table 16 and from the vicinity of the opposite ends of the base portion 4. Thus, for example, a pair of filter fan units (FFU) 46, 46' are preferably provided in the front and rear of the turn table 16 (in the front and rear areas of the base portion 4) along the advancing and withstanding direction, to prevent dust from rising from these portions. Furthermore, another filter fan unit (not shown in the drawings) is preferably provided on the bottom surface of the turn table 16 to deal with dust from the driving motor 20 or the like. If a high cleanliness is not critical, the filter fan units 46, 46' need not be provided.

48 is passage limit lines for the stacker crane. Shelves 49, 49 for semiconductor or liquid crystal substrates are arranged outside the limit lines 48, 48. Article placed positions are provided on these shelves 49, 49. Accordingly, the driving motor 20, the sprocket 38, and the chains 26, 36 are provided closer to the base portion 4 than to the article placed positions on the shelves 49, 49, preferably than to the shelves 49, 49, so as not to overlap the article placed positions in the vertical direction. In the embodiment, the driving motor 20, the sprocket 38, and the chains 26, 36 are arranged substantially within the base portion 4.

FIG. 2 schematically shows the structure of the interior of the turn table 16.

50 is a bearing that is a member for rotatively moving the slide fork 2 through, for example, 180 degrees. 52 is a belt connected to the rotative moving motor.

FIG. 3 shows a slide fork 62 according to a second embodiment. The slide fork 62 is similar to the slide fork 2, shown in FIGS. 1 and 2, except for the points indicated below. The same reference numerals denote the same components.

64 is a driving motor provided on the base portion 4 behind the turn table 16 to drive, for example, a pair of sprockets 66, 68 via a belt 70. The sprocket 66 for the middle portion 6 has a smaller diameter, while the sprocket 68 for the top portion 8 has a larger diameter. The sprockets 66, 68 are coaxially connected together and driven by the driving motor 64 via the belt 70.

In this embodiment, a plate, a frame, and the like are placed in the rear of the base portion 4 in order to arrange the motor 64 and others in position. Accordingly, most dust rises from the rear of the base portion 4 of the slide fork 62. Therefore, for example, an opening 72 is formed in this part so that the filter fan unit 46 provided under the opening 72 can deal with air with dust. Although the filter fan unit 46' is provided at the leading end of the base portion 4, it need not necessarily be provided.

The operation of each embodiment will be described.

The slide forks 2, 62 can be rotatively moved through, for example, 180 degrees by rotating the turn table 16. The slide forks 2, 62 can thus transfer articles to both sides of the platform 10. The power of the driving motors 20, 64 is transmitted to the sprockets 22, 24 or sprockets 66, 68, having the different diameters. As a result, the chains 26, 36, constituting a pair, are driven at different speeds. The stroke or speed ratio of the middle portion 6 to the top portion 8 is determined by properly determining the diameter ratio of the sprockets 22, 24 and sprockets 66 or 68. The extent to which the chains 26, 36 are arranged is determined in accordance with the determined stroke. Since the driving motors 20, 64, the sprockets, and the chains 26, 36 are all provided on the base portion 4, dust is unlikely to rise from the shelves or articles. Raised dust is dealt with by the filter fan units 46, 46' and others.

In the embodiment, the chains 26, 36 are used as driving members. However, timing belts may be used instead. In this case, the sprockets may be replaced with pulleys or the like.

Furthermore, instead of using the chains 26, 36 for driving, it is possible to use a pair of ball screws and vary the ratio of their rotation speeds so that the top portion 8 is provided with a feed that is about twice that for the middle chain 6.

In the embodiment, the driving motor, the chains, and the sprockets are all provided on the base portion 4. However, a motor and chains for driving the top portion 8 may be provided on the middle portion 6. In this case, the chains, sprockets, and driving motor are positioned so as not to protrude from the top portion 4 even when the middle portion 6 advances. Furthermore, the chains 26, 36 may be driven using different motors.

The invention claimed is:

1. A slide fork comprising:
   a middle portion and a top portion that advance and withdraw relative to a base portion to move said top portion forward and backward to a position where an article is placed,
   wherein the middle portion is fixed to a driving member for driving the middle portion and the top portion is fixed to a driving member for driving the top portion, wherein the driving members are driven by at least one motor, said driving members and said at least one motor being arranged closer to the base portion than to the position where the article is placed, so that the driving members and the motor do not overlap the position where the article is placed in a vertical direction, and wherein each of said driving members comprises an endless chain or belt, wherein said at least one motor disposed in the base portion is provided to directly drive at least one pair of sprockets or pulleys disposed in the base portion, wherein a length of each driving member of the pair of driving members is set so that a span of the driving member for the middle portion is shorter than that of the driving member for the top portion, and arrangement of a plurality of guide wheels is set so that each driving member moves in the base portion along a direction in which the top portion and middle portion move forward and backward.

2. The slide fork according to claim 1, wherein said base portion is provided with guide wheels comprising sprockets or pulleys disposed on a path of the chain or belt, and wherein no guide wheels comprising sprockets or pulleys are disposed in the middle portion or top portion.

* * * * *